(12) United States Patent
Loomis et al.

(10) Patent No.: US 9,275,173 B2
(45) Date of Patent: Mar. 1, 2016

(54) AUTOMATED GENERATION OF MASK FILE FROM THREE DIMENSIONAL MODEL FOR USE IN GRAYSCALE LITHOGRAPHY

(71) Applicant: University of Louisville Research Foundation, Inc., Louisville, KY (US)

(72) Inventors: James Loomis, Louisville, KY (US); Curtis McKenna, Louisville, KY (US); Kevin M. Walsh, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 0 days.

(21) Appl. No.: 14/396,977

(22) PCT Filed: Apr. 24, 2013

(86) PCT No.: PCT/US2013/038003
§ 371 (c)(1),
(2) Date: Oct. 24, 2014

(87) PCT Pub. No.: WO2013/163300
PCT Pub. Date: Oct. 31, 2013

(65) Prior Publication Data
US 2015/0121318 A1 Apr. 30, 2015

Related U.S. Application Data

(60) Provisional application No. 61/638,279, filed on Apr. 25, 2012.

(51) Int. Cl.
*G06F 17/50* (2006.01)
*G03F 1/70* (2012.01)

(52) U.S. Cl.
CPC .............. *G06F 17/5009* (2013.01); *G03F 1/70* (2013.01)

(58) Field of Classification Search
CPC ........... G03F 1/144; G03F 1/36; G03F 7/705; G03F 1/70; G06F 17/5009
USPC ...................................................... 716/50–56
See application file for complete search history.

(56) References Cited

U.S. PATENT DOCUMENTS 8,352,885 B2 * 1/2013 Liu et al. .......................... 716/51
8,589,829 B2 * 11/2013 Liu et al. .......................... 716/51

* cited by examiner

*Primary Examiner* — Binh Tat
(74) *Attorney, Agent, or Firm* — Wood, Herron & Evans, LLP

(57) ABSTRACT

A method, apparatus and program product automatically generate a grayscale lithography mask file (76) from a three dimensional (3D) model (72) of a desired topography, e.g., as generated by a three dimensional computer aided design (CAD) tool (70).

17 Claims, 4 Drawing Sheets

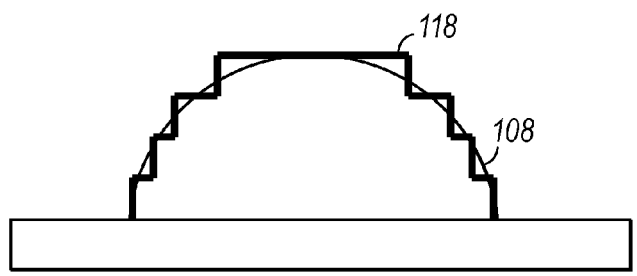
FIG. 7
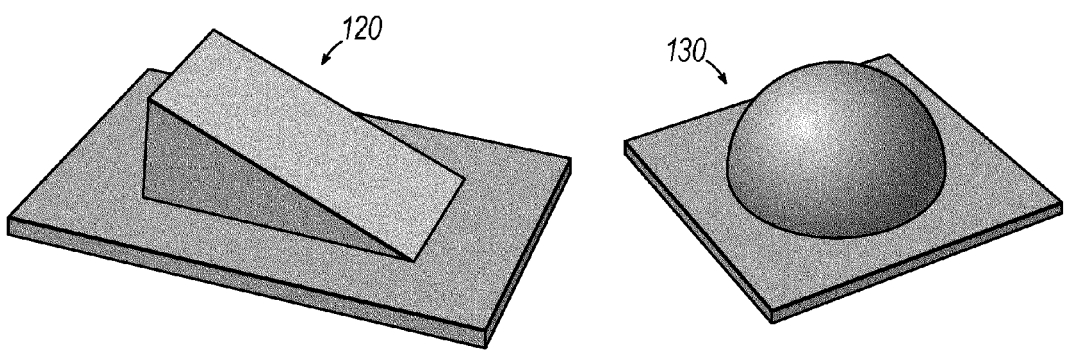
FIG. 8A
FIG. 9A
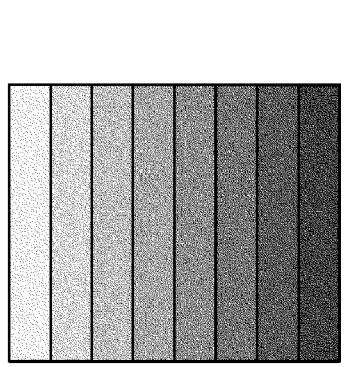
FIG. 8B
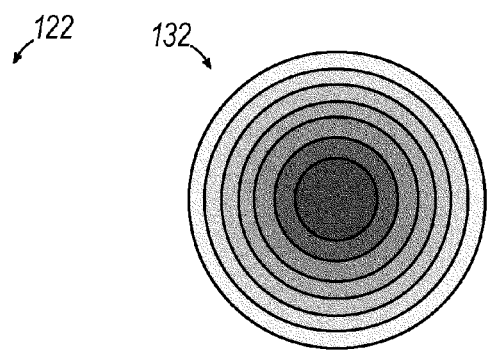
FIG. 9B

AUTOMATED GENERATION OF MASK FILE FROM THREE DIMENSIONAL MODEL FOR USE IN GRAYSCALE LITHOGRAPHY

CROSS REFERENCE TO RELATED APPLICATIONS

This application claims the benefit of and priority to U.S. Provisional Application Ser. No. 61/638,279 filed by James Loomis et al. on Apr. 25, 2012, and entitled "AUTOMATED GENERATION OF MASK FILE FROM THREE DIMENSIONAL MODEL FOR USE IN GRAYSCALE LITHOGRAPHY," which application is incorporated by reference in its entirety.

This invention was made with Government support under 0814194 awarded by the National Science Foundation. The Government has certain rights in this invention.

FIELD OF THE INVENTION

The invention is generally related to grayscale lithography, and in particular to the generation of a mask file for use in grayscale lithography.

BACKGROUND OF THE INVENTION

Semiconductor fabrication routinely relies on a number of fabrication processes to manufacture integrated circuit devices, or chips. Photolithography, for example, is routinely used in the creation of patterned layers of various materials on the surface of a substrate such as a semiconductor wafer. For example, in order to create a layer of conductive wires on the surface of a substrate, a thin film of metal may be deposited across the substrate followed by the deposition of a temporary layer of a photosensitive material referred to as photoresist. Photolithography is then used to form a desired geometric pattern in the photoresist by exposing the photoresist to light projected through an optical mask having apertures matching the desired geometric pattern. Exposure of the photoresist to light modifies the chemical properties of the exposed portions such that when the photoresist is developed, selected portions of the photoresist material are removed and an area of the surface of the substrate corresponding to the desired geometric pattern is accessible through the photoresist. Etching may then be performed to remove the portions of the thin film not covered by the photoresist, followed by removal of the remaining photoresist material, leaving a thin film of metal patterned according to the desired geometric pattern.

Optical masks used in photolithography are typically generated using computer software, and are often manufactured themselves using a photolithographic process that etches apertures into an opaque film disposed on a transparent substrate. The geometric patterns for the masks are typically stored in electronic form as mask files, which are fed to a stepper or scanner to pattern the mask with the desired geometric pattern.

In addition, an alternative photolithography technique referred to as maskless lithography eliminates the use of an optical mask, and instead scans a narrow beam over the photoresist to directly write the desired geometric pattern into the photoresist. As with the mask files used to create optical masks, the electronic data that controls the maskless lithography process to write a desired geometric pattern into the photoresist is also referred to as a mask file, and is generated using computer software.

A common feature of traditional mask-based and maskless photolithography is that they are typically binary processes. Put another way, with both mask-based and maskless photolithography, the photoresist layer is effectively opaque for any areas of a substrate that are covered by the photoresist material, while for areas where the photoresist material has been removed, the underlying areas of the substrate are fully exposed for subsequent processes such as etching.

Grayscale lithography, in contrast, is a technique used to expose different areas of a photosensitive substrate to various intensities of light. By controlling the amount of light each region of the substrate is exposed to, the depth at which photoresist is developed can be carefully controlled. This process can result in the creation of complex three dimensional (3D) structures in photoresist simply from using a single exposure lithographic technique, which may then be copied to an underlying substrate using an etching technique such as deep reactive-ion etching (DRIE) to generate a topography including complex three dimensional shapes on the surface of a substrate. Grayscale lithography is of particular interest for use in fabricating microelectromechanical systems (MEMS) such as micro- or nano-scale sensors and actuators, microfluidics, and microoptical components like microlenses, diffractive elements or hybrids.

While grayscale lithography provides an extremely versatile tool for MEMS fabrication, grayscale lithography is a relatively underutilized process. In part, the underutilization of grayscale lithography is due to time and effort required to create mask files suitable for defining complex 3D topographies, e.g., to control a maskless laser lithography system such as a laser pattern generator. Many such systems utilize mask files that define multiple layers, with each layer corresponding to a different level of exposure, and with geometric objects defined in each layer to define the desired three dimensional profile. Particularly for complex topographies, the manpower required to generate the mask files can be cost and time prohibitive. In addition, in many instances, the calculations required to generate the mask files are too complex to be completed by hand.

Therefore, a significant need exists in the art for an improved method for creating mask files used in connection with grayscale lithography.

SUMMARY OF THE INVENTION

The invention addresses these and other problems associated with the prior art by providing a method, apparatus and program product for automatically generating a grayscale lithography mask file from a three dimensional (3D) model of a desired topography, e.g., as generated by a three dimensional computer aided design (CAD) tool. Embodiments consistent with the invention, for example, may analyze a three dimensional model and generate therefrom a multi-layer mask file including two-dimensional geometric objects defined in various layers corresponding to various energy levels/amounts of exposure applied during grayscale lithography.

Therefore, consistent with one aspect of the invention, a mask file for use in grayscale lithography is generated by generating mask data from a three-dimensional (3D) model of a surface topography, and generating a mask file from the mask data, where the mask file is readable by a grayscale lithography device.

These and other advantages and features, which characterize the invention, are set forth in the claims annexed hereto and forming a further part hereof. However, for a better understanding of the invention, and of the advantages and objectives attained through its use, reference should be made to the

BRIEF DESCRIPTION OF THE DRAWINGS

FIG. 7 is a functional elevational cross-sectional view of the 3D model of FIG. 3, and with an example grayscale mask file superimposed thereon.

FIG. 8A is a perspective view of an example ramp 3D model, and FIG. 8B is a mask file representation thereof generated by the process of FIG. 1.

FIG. 9A is a perspective view of an example dome 3D model, and FIG. 9B is a mask file representation thereof generated by the process of FIG. 1.

DETAILED DESCRIPTION

Figure 1:
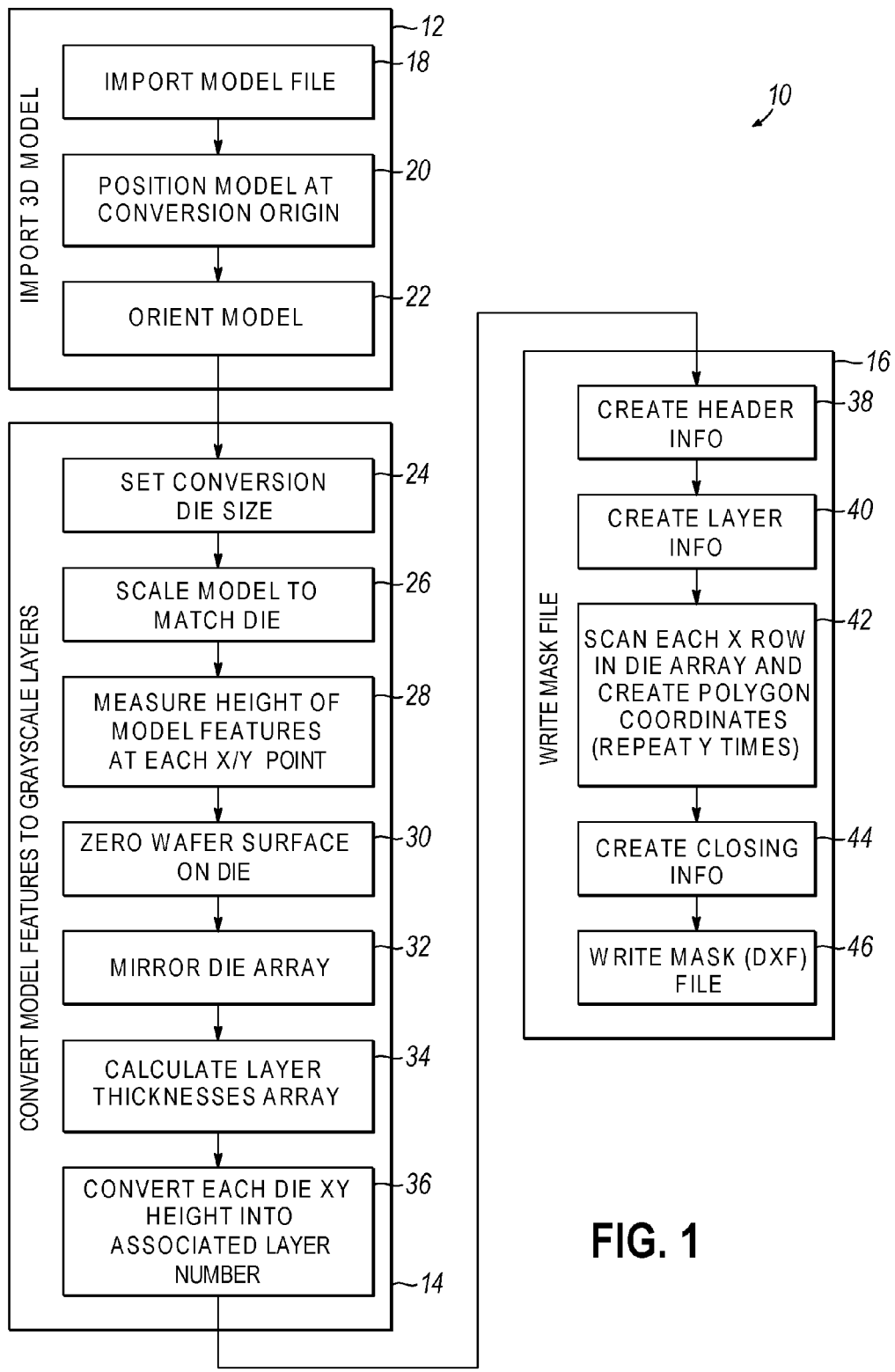
FIG. 1 is a flowchart of an automated mask file generation process consistent with the invention.

Embodiments consistent with the invention automatically generate a mask file suitable for use in grayscale lithography from a 3D model of a desired topography to be formed on the surface of a substrate such as a semiconductor wafer. For example, embodiments consistent with the invention may automatically generate a grayscale lithography mask file from a three dimensional (3D) model of a desired topography defined by a 3D computer aided design (CAD) tool, e.g., SolidWorks available from Dassault Systemes, S. A., AutoCAD available from Autodesk, Inc., or other commercially-available 3D CAD tools. Embodiments consistent with the invention, for example, may analyze a three dimensional model and generate therefrom a multi-layer mask file including two-dimensional geometric objects defined in various layers corresponding to various amounts of exposure during grayscale lithography.

Embodiments consistent with the invention, in particular, may convert a three-dimensional representation of a surface topology, e.g., as defined in a stereolithography (STL) file format, into a multilayer representation with a plurality of layers corresponding to varying exposure levels or values, and with two dimensional (2D) geometric objects defined in the plurality of layers to model the desired surface topology. The resulting multilayer representation may be output in a file format suitable for a target grayscale lithography device, e.g., a DXF file suitable for use by a maskless laser lithography system such as the DWL 66FS laser lithography system available from Heidelberg Instruments Mikrotechnik GmbH. It will be appreciated that different file formats, for both the input 3D model and the output mask file, may be used to conform to the particular 3D modeling application and/or grayscale lithography device to be used.

In some embodiments, generation of the mask file may be performed by conversion software capable of reading a 3D model file created by a 3D CAD tool and generating therefrom a mask file in a suitable format for a desired grayscale lithography device. Mask data, e.g., in the form of a two-dimensional array of heights and/or layer assignments may be generated from the 3D model and used to generate a mask file in a suitable format for the particular grayscale lithography device that uses the mask file. The mask data, for example, may be used to essentially control the relative exposure levels or values for the grayscale lithography device at a plurality of locations along the surface of a die, wafer or other substrate. Thus, for example, various units and scaling operations may be used to adapt a surface topology defined by a 3D model into suitable control signals for a particular grayscale lithography device. Thus, for example, mask data may be represented as a two-dimensional array of heights of a surface topology from the surface, distances from another reference plane, or layer identifiers associated with different layers used to segment a 3D model. Mask data may also include actual exposure values adapted for a particular grayscale lithography device. A wide variety of alternate representations of mask data may be used, and thus the invention is not limited to the particular implementations disclosed herein.

The conversion software may be configurable to vary the number of layers (e.g., between 2 and 512 layers, although greater than 512 layers may also be used in some embodiments), and thus exposure level (Z) resolution, as well as the layer size and (XY) resolution of the pixels defining each layer. In addition, the conversion software may be configurable to generate either a normal or inverted mask, as well as to utilize either linear or non-linear segmentation. In the latter instances, the type of segmentation may be used to control the height of each layer according to a desired equation to correct for non-linear energy absorption characteristics of photoresist as well as the performance profile of the target grayscale lithography device. Moreover, the conversion software may be capable of automatically scaling a 3D model to appropriate dimensions for a desired application.

In one embodiment, for example, a mask generation tool may output a DXF format file that is similar to those generated by programs used to manually generate mask files, e.g., the L-edit tool available from Tanner EDA. However, the mask file output by the mask generation tool may include additional layer information that controls how much power is exposed by the grayscale lithography device at each XY position.

Among other benefits, embodiments consistent with the invention expand the design field for MEMS and other applications of grayscale lithography by permitting a large pool of engineering professionals with preexisting skill sets in the area of 3D modeling to design MEMS and other devices with 3D topologies, and using known tool such as SolidWorks and AutoCAD with which these professionals are already acquainted. In addition, MEMS applications may be expanded to more complex topographies, and more complex mask files may be generated than could otherwise be generated manually. Furthermore, device-specific and photoresist-specific variabilities may be accommodated through selection of appropriate linear and/or non-linear segmentation options.

Other alternatives and modifications will be discussed in greater detail below.

Now turning to the Drawings, wherein like numbers denote like parts throughout the several views, FIG. 1 illustrates an exemplary automated process 10 for generating a grayscale lithography mask file from a 3D model. The generation of a grayscale lithography mask file may include, for example, importing the 3D model (block 12), converting model features to grayscale layers (block 14), and writing the mask file (block 16). In the illustrated embodiment, blocks 12-16 in process 10 typically may be implemented in an automated fashion, utilizing a computer or other electronic device to implement at least portions of such operations.

Figure 2:
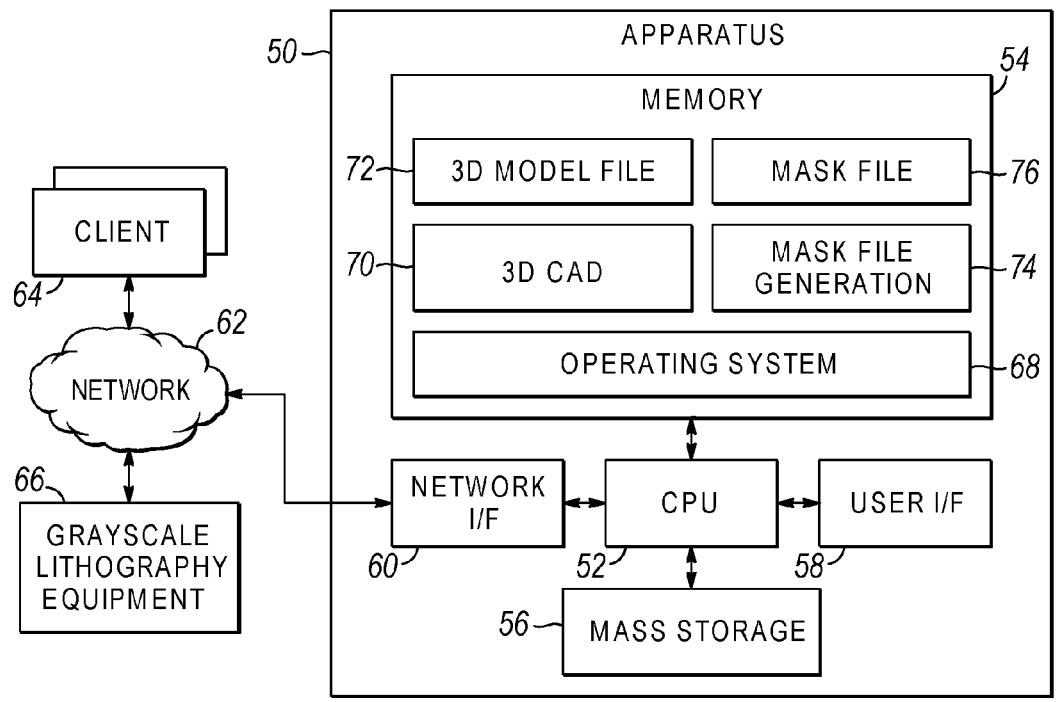
FIG. 2 is a block diagram of an exemplary apparatus suitable for implementing steps from the process of FIG. 1.

FIG. 2, for example, illustrates an exemplary apparatus 50 within which various steps from process 10 may be implemented in a manner consistent with the invention. For the purposes of the invention, computer 50 may represent practically any type of computer, computer system or other programmable electronic device. Moreover, computer 50 may be implemented using one or more networked computers, e.g., in a cluster or other distributed computing system, or may be implemented within a single computer or other programmable electronic device, e.g., a desktop computer, laptop computer, handheld computer, cell phone, set top box, etc.

Computer 50 typically includes a central processing unit 52 including at least one microprocessor coupled to a memory 54, which may represent the random access memory (RAM) devices comprising the main storage of computer 50, as well as any supplemental levels of memory, e.g., cache memories, non-volatile or backup memories (e.g., programmable or flash memories), read-only memories, etc. In addition, memory 54 may be considered to include memory storage physically located elsewhere in computer 50, e.g., any cache memory in a processor in CPU 52, as well as any storage capacity used as a virtual memory, e.g., as stored on a mass storage device 56 or on another computer coupled to computer 50. Computer 50 also typically receives a number of inputs and outputs for communicating information externally. For interface with a user or operator, computer 50 typically includes a user interface 58 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 50 may also include one or more mass storage devices 56, e.g., a floppy or other removable disk drive, a hard disk drive, a direct access storage device (DASD), an optical drive (e.g., a CD drive, a DVD drive, etc.), and/or a tape drive, among others. Furthermore, computer 50 may include an interface 60 with one or more networks 62 (e.g., a LAN, a WAN, a wireless network, and/or the Internet, among others) to permit the communication of information with other computers and electronic devices, e.g., one or more client computers 64 and a grayscale lithography device 66, e.g., a maskless laser lithography system or laser pattern generator (LPG) with grayscale capability. It should be appreciated that computer 50 typically includes suitable analog and/or digital interfaces between CPU 52 and each of components 54, 56, 58 and 60 as is well known in the art. Other hardware environments are contemplated within the context of the invention.

Computer 50 operates under the control of an operating system 68 and executes or otherwise relies upon various computer software applications, components, programs, objects, modules, data structures, etc., as will be described in greater detail below. Moreover, various applications, components, programs, objects, modules, etc. may also execute on one or more processors in another computer coupled to computer 50 via network 62, e.g., in a distributed or client-server computing environment, whereby the processing required to implement the functions of a computer program may be allocated to multiple computers over a network.

As an example, computer 50 may include a three dimensional (3D) computer aided design (CAD) system program 70 used to generate a 3D model suitable for defining a desired 3D topology for a MEMS or other substrate, e.g., the aforementioned SolidWorks 3D CAD application. The 3D model may be represented and stored in a 3D model file 72, e.g., an STL format file, or in any other suitable format capable of being output by program 70.

3D model file 72 serves as an input to a mask file generation tool 74, which generates a mask file 76 from 3D model file 72, and which is suitable for use by grayscale lithography device 66. It will be appreciated that mask file generation tool 74 may be installed in a separate computer from 3D CAD application 70, and that communication of mask file 76 to device 66 may be performed in other manners, e.g., via storing the mask file on a USB storage device or other tangible computer readable medium and loading the mask file directly into a controller for device 66.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to physical, tangible storage media such as volatile and non-volatile memory devices, floppy and other removable disks, hard disk drives, magnetic tape, optical disks (e.g., CD-ROMs, DVDs, etc.), among others, and transmission media such as digital and analog communication links.

In addition, various program code described herein may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Mask File Generation

An exemplary process for generating a grayscale lithography mask file, as noted above, is illustrated in FIG. 1, which begins in block 12 by importing a 3D model, e.g., by retrieving a 3D model file 72 using mask generation tool 74 of FIG. 2. The 3D model may be developed in any suitable computer program, e.g., a 3D CAD application such as SolidWorks, which generates a 3D model file defining a surface topology in a 3D coordinate system. During development of the 3D model, it may be desirable to place the model on a "neutral plane" (or wafer section) having particular dimensions and characteristics that can be used by the mask generation tool to properly orient the model prior to conversion. For example, in one embodiment, it may be desirable to define a neutral plane that is square in shape, a specified thickness (e.g., 10 units in the model's defined coordinate system), and with a border of a specified number of units (e.g., 1 unit) between the edge of the model and the edge of the neutral plane. In addition, it may be desirable to provide to the mask generation tool several critical dimensions for the model, e.g., the height/width dimension of the neutral plane and the height from the surface of the neutral plane to the tallest feature of the model.

In addition, it may be desirable to specify a particular unit/coordinate system for the model, which may then be entered into the mask generation tool to assist in converting the model to the proper dimensions for the fabricated part. Typically, the precise units selected in the 3D CAD application do not affect mask generation so long as they are also provided to the mask generation tool, and in some embodiments, whatever units are selected for the 3D model file may be treated as corresponding to a predetermined unit for the mask, e.g., where 1 unit=1 micron. It may also be desirable to place a corner of the neutral plane at the origin of the coordinate system, and orient the axes so that the z-axis is perpendicular to the neutral plane and positive in the direction facing up from the neutral plane. The mask generation tool 74 may be configured to convert only features that are above the surface of the neutral plane, such that any features within the neutral plane or below it will be ignored.

When generating the model, it should be appreciated that the illustrated embodiment of the mask generation tool only generates mask elements corresponding to a "top view" of the model, and as such, undercuts or inside cavities will not be converted. In other embodiments, however, such features may be supported. In addition, absolute feature height in a model may not be not particularly important, since the total number of layer sections will be scaled by the illustrated mask generation tool to the total part height so that the relative height of features with respect to one another controls the mask generation process.

In addition, prior to mask generation, it may be desirable to set one or more controllable parameters in the mask generation tool, e.g.:

XY resolution (250 nm default)—Conversion from solid model to grayscale results in a pixilation of the model, and as such, the XY resolution may be set to a size that desirably does not affect functionality.

Z Resolution (128 default)—Equivalent to the number of vertical layers defined in the mask file, and the number of times the model is vertically sliced. Larger numbers of slices result in a finer z resolution.

Normal/Inverted Mask (normal default)—Using the normal option, the layer closest to the neutral plane is the zero layer, and the layer furthest from the neutral plane is the highest layer number (i.e. layer 127).

Linear/Non-linear segmentation (linear default)—Determines how the individual layer heights are calculated. With linear segmentation, each layer is the same thickness. With non-linear segmentation, equations can be selected to allow for varying layer thicknesses. This can be useful in correcting non-linear energy absorption characteristics of the photoresist and/or non-linear laser profiles.

The model may be output in a number of different formats. For example, it may be desirable to output the model as an STL file from SolidWorks, with options selected for exporting the units and coordinate system with the file.

Now returning to FIG. 1, importation of the model in block 12 may include importing the model file (block 18), positioning the model at the conversion origin (block 20) and orienting the model (block 22). Importing of the model file typically includes loading the model file into memory, while positioning the model at the conversion origin and orienting the model (e.g., by moving, rotating and/or scaling the model) locates the model in a predetermined location in the conversion coordinate system in advance of mask generation. In some embodiments, e.g., where appropriate set-up of the model is performed in the 3D CAD application, blocks 20 and/or 22 may not be performed.

Figure 3:
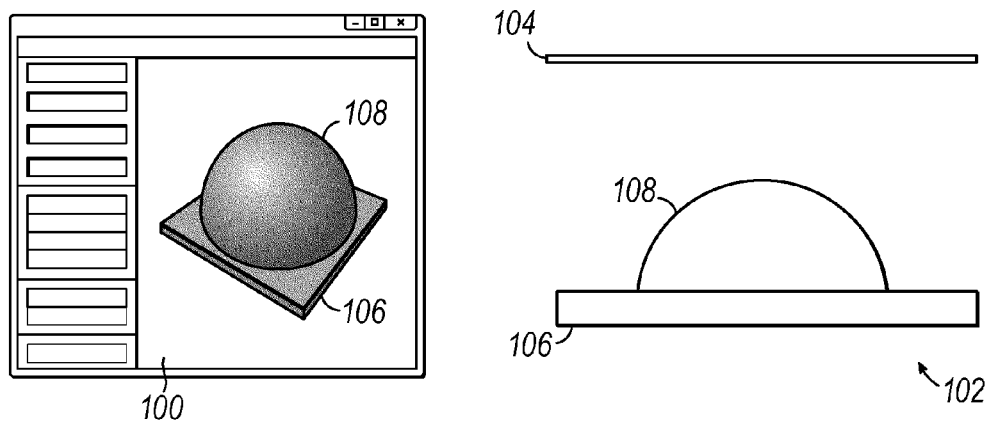
FIG. 3 is a block diagram illustrating placement of a reference plane relative to a 3D model of a surface topology by the process of FIG. 1.
Figure 4:
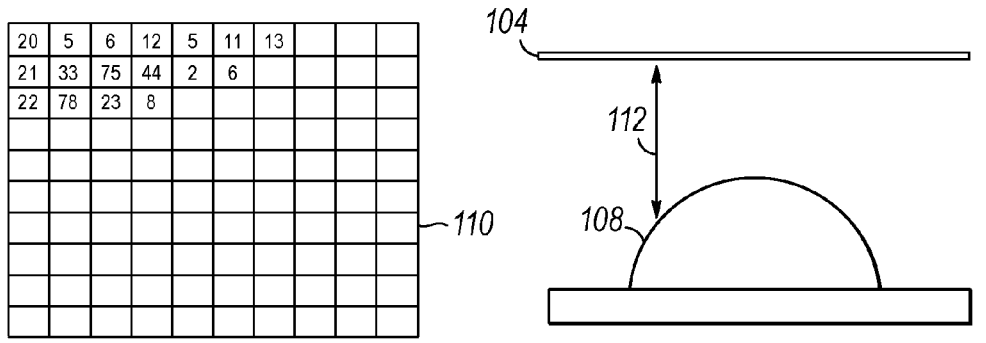
FIG. 4 is a block diagram illustrating the generation of a reference array for the 3D model of FIG. 3.

Next, in block 24, the conversion die size is set based on the selected XY resolution, and in block 26, the model is scaled to match the desired die size. Then, in block 28, the height of the model features is determined at each XY point. For example, FIG. 3 illustrates an example 3D model 100 that is shown in an elevational cross-sectional view at 102. In order to determine the height of the model, it may be desirable to generate a reference plane 104 that is spaced apart from and parallel to the neutral plane 106 so that measurements of the model features (e.g., for model feature 108) may be taken relative to reference plane 104. Then as shown in FIG. 4, a two dimensional reference or die array 110 having $n^2$ elements (where n=die dimensions/XY resolution, e.g., with a die size of 2.5 um×2.5 um, and a resolution of 250 nm, a 10×10 array may be used to define the example model illustrated in FIG. 3) may be populated with the distances between reference plane 104 (illustrated at 112) and feature 108 at each XY location for the model.

Thereafter, various array operations may be performed on the array depending upon the settings chosen in the tool. For example, returning to FIG. 1, in block 30 the wafer surface may be zeroed on the die and in block 32 the die array may be mirrored, effectively determining the height of the model relative to the neutral plane/wafer surface. Other operations may also be performed in other embodiments.

Next, the values stored in the array are used to assign a layer number to each XY location for the model. Block 34, in particular, calculates a layer thickness array that specifies for each layer a thickness, or alternatively, an associated range of heights or distances from the neutral plane, so that in block 36 each XY location may be assigned a layer number corresponding to the layer within which the top surface of the model is disposed at that XY location. The layer thicknesses may be determined based upon a number of factors, e.g., polymer characteristics, number of layers, maximum feature height for the model, laser or other device profiles, user selections, etc.

Figure 5:
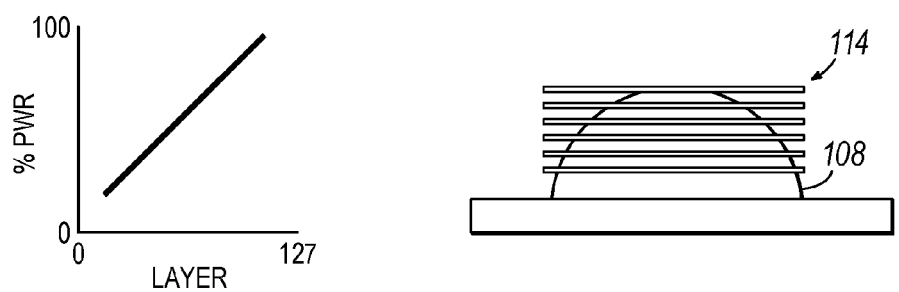
FIG. 5 is a block diagram illustrating linear segmentation of the 3D model of FIG. 3.
Figure 6:
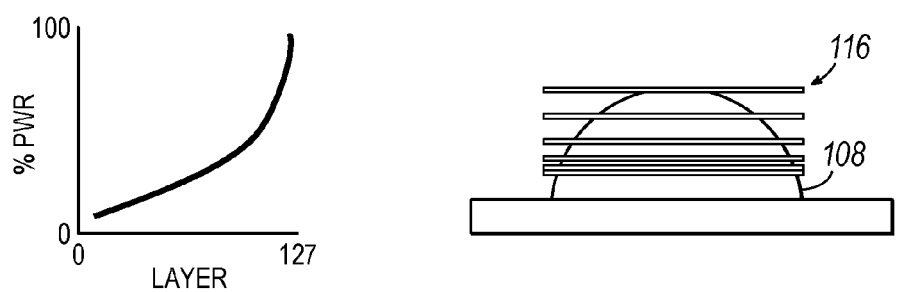
FIG. 6 is a block diagram illustrating non-linear segmentation of the 3D model of FIG. 3.

For example, it may be desirable to convert the model height to a range of 0-100% and apply either a linear segmentation or non-linear segmentation algorithm to segment the layers. A linear segmentation, which is illustrated at 114 in FIG. 5, segments the model such that the configured number of layers are of equal thickness, and so that a linear relationship is defined between layer number and % PWR (the relative energy or level of exposure applied by the grayscale lithography device). Conversely, a non-linear segmentation, which is illustrated at 116 in FIG. 6, segments the model such that the configured number of layers are of differing thicknesses, so that a non-linear relationship exists between layer number and % PWR. A non-linear segmentation may be used to account for laser and/or photoresist profiles.

Returning to FIG. 1, after layer numbers have been assigned to each XY location, block 16 generates a mask file from the array of layer numbers. Block 38, in particular, creates appropriate header information, e.g., for the DXF file format, while block 40 creates layer information corresponding to the layers used to segment the model. Block 42 then scans each row in the X direction in the array and creates one or more sets of polygon coordinates corresponding to the various geometry elements or blocks to be used to define the mask. In particular, in the illustrated embodiment, block 42 scans along a row and combines all adjacent array elements having the same assigned layer number, and creates a rectangular geometric element or block with coordinates corresponding to the corners of the array elements sharing the same assigned layer, and places that block in the assigned layer. For any other array elements having different assigned layers in the same row, a similar operation is performed so that each array element in the row that forms a portion of the model is represented in a block assigned to an appropriate layer in the mask.

Block 42 is repeated for each row in the array, and once all rows have been processed, block 44 creates closing information for the file, according to the DXF format. Block 46 then writes the mask file in the DXF format, and process 10 is complete. The mask file is then suitable for input to the grayscale lithography device, and may be stored in the device via a network, or via a portable storage device, or in other manners known in the art. FIG. 7, for example, illustrates an exemplary profile of a mask 118 created for model feature 108. Likewise, FIGS. 8A-8B illustrate respectively a ramp model 120 and corresponding mask file 122 and FIGS. 9A-9B illustrate respectively a dome model 130 and corresponding mask file 132, where the colors or shades in the mask files 122, 132 are used to represent different layers/exposure levels.

It will be appreciated that other algorithms may be used to generate the mask file from the array. For example, no combining of adjacent elements may be performed, such that a separate block is created for each element of the array. Alternatively, scanning may be performed through columns, with elements in the same column sharing the same layer number being combined in a similar manner to that described above for block 42. As another alternatively, elements in different rows and different columns may be combined, and non-rectangular geometric elements may be used to define different portions of a mask file. Other manners of combining elements, and thereby reducing the size and complexity of the mask file, may be used in other embodiments.

Moreover, it will be appreciated that the mask file generated in the manner described above will typically omit all geometry below the top surface of the model, although in other embodiments, the structure underneath the top surface may also be defined in the mask file. In addition, it will be appreciated that for other mask file formats and other grayscale lithography equipment, other operations may be performed in order to generate a mask file that is suitable for a given application.

Conclusion

Embodiments of the invention therefore provide for the ability to facilitate the generation of complex structures from a single lithographic process through the automated generation of a mask file from a 3D model. Beyond the aforementioned MEMS applications, embodiments of the invention may have other uses in a wide variety of applications, e.g., when a need exists to quickly generate a variety of different curved resist structures for testing/optimization, for curved popup MEMS structures, for curved profiles for PDMS molds, or in other situations where it is desirable to provide high aspect ratio features in silicon (e.g., due to resist and silicon having different DRIE etch rates).

Other modifications and advantages will be apparent to one of ordinary skill in the art. Therefore, the invention lies in the claims hereinafter appended.

What is claimed is:

1. A method of generating a mask file for use in grayscale lithography for exposing a photoresist layer, comprising:
   using at least one processor, generating mask data from a three-dimensional (3D) model of a surface topography that is reflective of a 3D structure to be formed in the photoresist layer;
   the generation of the mask data including:
      segmenting the 3D model into a plurality of layers that are each associated with an exposure value;
      determining, at a plurality of locations, the distance from the 3D model to a reference plane; and
      associating each of the plurality of locations with an exposure value, including associating each of the locations with a layer based on the determined distance;
   generating a mask file from the mask data, wherein the mask file is in a format for controlling a grayscale lithography device to form the 3D photoresist structure.

2. The method of claim 1, wherein the 3D model is defined in a 3D model file output by a 3D computer aided design (CAD) application.

3. The method of claim 2, further comprising building the 3D model with the 3D CAD application.

4. The method of claim 2, wherein the 3D model file is in an STL format, and wherein the mask file is in a DXF format.

5. The method of claim 1, wherein generating the mask data comprises:
   determining a height of the 3D model at a plurality of locations as a distance from the 3D model to a reference plane that is oriented parallel to a neutral plane for the 3D model; and
   associating each of the plurality of locations with an exposure value for the grayscale lithography device based upon the determined height therefor.

6. The method of claim 5, wherein the plurality of locations are arranged in a two dimensional array oriented parallel to the neutral plane for the 3D model.

7. The method of claim 1, wherein segmenting the 3D model includes performing linear segmentation of the 3D model.

8. The method of claim 1, wherein segmenting the 3D model includes performing non-linear segmentation of the 3D model.

9. The method of claim 8, wherein the non-linear segmentation of the 3D model is based upon at least one of a device profile and a photoresist profile.

10. The method of claim 1, wherein generating the mask file includes defining the plurality of layers in the mask file and defining a plurality of blocks in the plurality of layers based upon the layers associated with the plurality of locations.

11. The method of claim 10, wherein generating the mask file includes combining into the same block adjacent locations among the plurality of locations having a same associated layer.

12. The method of claim 1, further comprising performing grayscale lithography on a substrate using the mask file.

13. An apparatus, comprising:
   at least one processor; and
   program code configured upon execution by the at least one processor to generate a mask file for use in grayscale lithography for exposing a photoresist layer, the mask file generation including generating mask data from a three-dimensional (3D) model of a surface topography that is reflective of a 3D structure to be formed in the photoresist layer including determining, at a plurality of locations, the distance from the 3D model to a reference plane and associating each of the plurality of locations with an exposure value based on the determined distance and generating a mask file from the mask data, wherein the mask file is in a format for controlling a grayscale lithography device to form the 3D photoresist structure.

14. The apparatus of claim 13, wherein the 3D model is defined in a 3D model file output by a 3D computer aided design (CAD) application.

15. The apparatus of claim 14, wherein the 3D model file is in an STL format, and wherein the mask file is in a DXF format.

16. The apparatus of claim 13, wherein the program code is configured to generate the mask data by:
  determining a height of the 3D model at a plurality of locations as a distance from the 3D model to a reference plane that is oriented parallel to a neutral plane for the 3D model; and
  associating each of the plurality of locations with an exposure value for the grayscale lithography device based upon the determined height therefor.

17. A program product, comprising:

a non-transitory computer readable medium; and program code resident on the computer readable medium and configured upon execution by at least one processor to generate a mask file for use in grayscale lithography for exposing a photoresist layer, the mask file generation including generating mask data from a three-dimensional (3D) model of a surface topography that is reflective of a 3D structure to be formed in the photoresist layer including determining, at a plurality of locations, the distance from the 3D model to a reference plane and associating each of the plurality of locations with an exposure value based on the determined distance and generating a mask file from the mask data, wherein the mask file is in a format for controlling a grayscale lithography device to form the 3D photoresist structure.

* * * * *